(12) United States Patent
Richter et al.

(10) Patent No.: US 10,707,068 B2
(45) Date of Patent: Jul. 7, 2020

(54) COMBINED WAFER PRODUCTION METHOD WITH A MULTI-COMPONENT RECEIVING LAYER

(71) Applicant: Siltectra GmbH, Dresden (DE)

(72) Inventors: Jan Richter, Dresden (DE); Christian Beyer, Freiberg (DE); Anas Ajaj, Dresden (DE)

(73) Assignee: Siltectra GmbH, Dresden (DE)

( * ) Notice: Subject to any disclaimer, the term of this patent is extended or adjusted under 35 U.S.C. 154(b) by 0 days.

(21) Appl. No.: 15/515,480

(22) PCT Filed: Sep. 24, 2015

(86) PCT No.: PCT/EP2015/071949
§ 371 (c)(1),
(2) Date: Mar. 29, 2017

(87) PCT Pub. No.: WO2016/050597
PCT Pub. Date: Apr. 7, 2016

(65) Prior Publication Data
US 2018/0233347 A1    Aug. 16, 2018

(30) Foreign Application Priority Data
Sep. 29, 2014 (DE) .................... 10 2014 014 420

(51) Int. Cl.
*H01L 21/00* (2006.01)
*H01L 21/02* (2006.01)
(Continued)

(52) U.S. Cl.
CPC ...... *H01L 21/0201* (2013.01); *H01L 21/6836* (2013.01); *H01L 21/76254* (2013.01); *H01L 21/76259* (2013.01)

(58) Field of Classification Search
CPC .......... H01L 21/02013; H01L 21/0201; H01L 21/6836
See application file for complete search history.

(56) References Cited

U.S. PATENT DOCUMENTS 7,960,248 B2 * 6/2011 Di Cioccio ....... H01L 21/76254
257/E21.122
2008/0012140 A1   1/2008 Tsukano
(Continued)

FOREIGN PATENT DOCUMENTS

DE    102014013107    4/2015
EP      2073260       6/2009
(Continued)

OTHER PUBLICATIONS

English translation of International search report for corresponding PCT application PCT/EP2015/071949.
(Continued)

*Primary Examiner* — Richard A Booth
(74) *Attorney, Agent, or Firm* — Murphy, Bilak & Homiller, PLLC

(57) ABSTRACT

The present invention relates to a method for producing solid body layers. The claimed method comprises at least the following steps: providing a solid body (2) for separating at least one solid body layer (4), arranging a receiving layer (10) on the solid body for holding the solid body layer (4), said receiving layer being made of at least one polymer and an additional material, said receiving layer, in terms of volume, be made mainly of polymer, the additional material having a greater conductivity than the polymer, and the receiving layer (10) is subjected to thermal stress, in particular, mechanical stress, for generating voltages in the solid body (2), wherein a crack in the solid body (2) along a separation plane (8) expands due to the voltages, the solid (Continued)

layer (4) being separated from the solid body (2) due to the crack.

11 Claims, 2 Drawing Sheets

(51) Int. Cl.
*H01L 21/762* (2006.01)
*H01L 21/683* (2006.01)

(56) References Cited

U.S. PATENT DOCUMENTS

| | | |
|---|---|---|
| 2010/0289189 A1 | 11/2010 | Lichtensteiger |
| 2011/0259936 A1 | 10/2011 | Lichtensteiger |

FOREIGN PATENT DOCUMENTS

| | | |
|---|---|---|
| WO | 2010072675 | 7/2010 |
| WO | 2013113730 | 8/2013 |

OTHER PUBLICATIONS

Written Opinion for corresponding PCT application PCT/EP2015/071949.

* cited by examiner

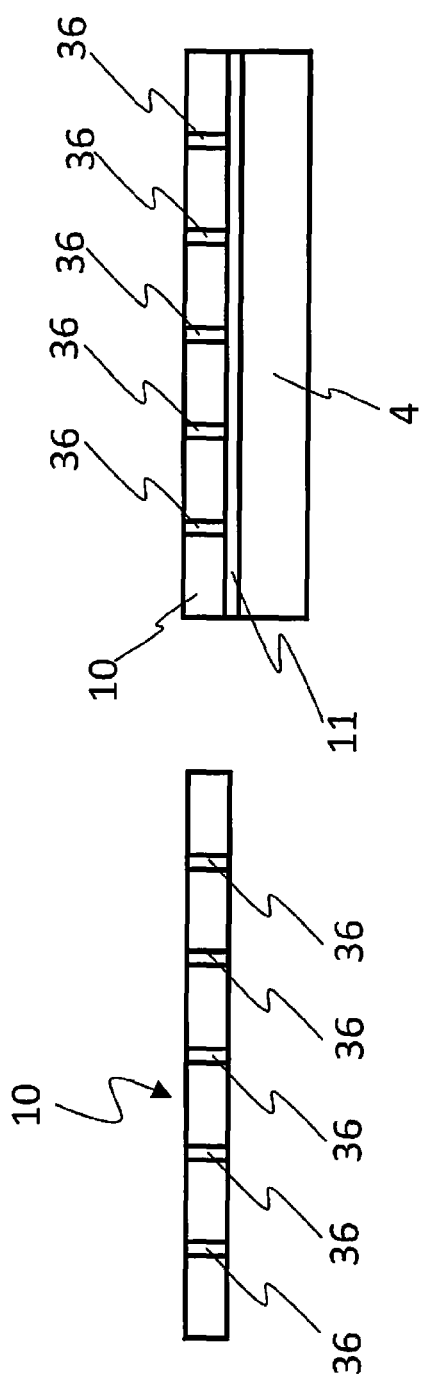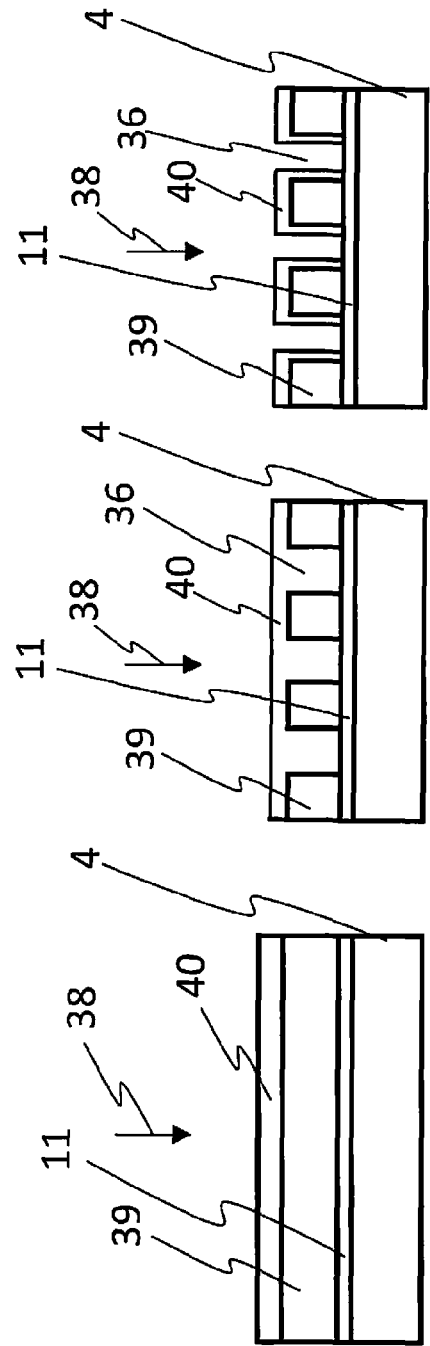

COMBINED WAFER PRODUCTION METHOD WITH A MULTI-COMPONENT RECEIVING LAYER

The present invention relates to a method for manufacturing solid state layers according to the subject matter of claim 1, a wafer produced by means of this process according to claim 12, a film according to claim 13 and a use of said film according to claim 14.

Materials such as silicon, germanium or sapphire are needed in many technical fields (e.g., microelectronics or photovoltaic technology), often in the form of thin slices and panels (also called wafers). Conventionally, such wafers are currently produced by sawing from an ingot, and this involves relatively large material losses ("kerf-loss"). Since the raw material used is often very expensive, concerted attempts have been made to produce such wafer with less material and thus more efficiently and less expensively.

For example, with the currently standard practice, almost 50% of the material used is wasted as "kerf-loss" just in the production of silicon wafers for solar cells. Globally, this represents an annual loss of more than 2 billion euros. Since the costs of the wafer account for the largest fraction of the costs of the finished solar cell (over 40%), the costs of solar cells might be significantly reduced if corresponding improvements were made in wafer fabrication.

Methods that do not rely on conventional sawing and can split a thin wafer off of a thicker workpiece e.g., by using thermally-induced stresses, seem particularly attractive for such wafer manufacturing without kerf-loss ("kerf-free wafering"). These particularly include methods such as those described for example in PCT/US2008/012140 and PCT/EP2009/067539, in which a applied polymer layer applied to the workpiece is used to generate these stresses.

In the methods cited, the polymer layer has a coefficient of thermal expansion approximately two orders of magnitude greater than that of the workpiece. In addition, a relatively high modulus of elasticity may be achieved by utilising a glass transition, so that cooling can induce stresses in the polymer layer-workpiece layer system that are large enough to enable wafers to be split off from the workpiece.

When a wafer is split off from the workpiece, in the methods described above some polymer is left sticking to either side of the polymer. The wafer bends very significantly towards this polymer layer, making it more difficult split the wafer off in controlled manner and may result in variations in the thickness of the split wafer, for example. The marked curvature also makes further processing more difficult and can even cause the wafer to break.

When the methods according to the prior art are used, each wafer produced usually exhibits relatively large thickness variations, wherein the spatial thickness distribution often shows a pattern with fourfold symmetry. When the methods of the prior art are used, the total thickness variation (TTV) viewed over the entire wafer is frequently equal to more than 100% of the average wafer thickness (for example, a wafer with an average thickness of 100 micrometres which is for example 50 micrometres thick at its thinnest point and 170 micrometres thick at its thickest point, has a TTV of 170−50=120 micrometres, corresponding to a total thickness variation of 120% relative to its average thickness). Wafers with such significant thickness variations are not suitable for many applications. In addition, in the case of the most commonly occurring fourfold thickness distribution patterns, the areas with the largest variations are unfortunately located in the centre of the wafer, where they are most inconvenient.

Moreover, in the method according to the current prior art, undesirable oscillations in the layer systems involved occur during the break propagation upon separation, which oscillations have a negative effect on the development of the break front and may in particular lead to significant thickness variations of the separated wafer.

The polymer also takes a long time to cool down, so the solid body is also significantly tempered or cooled, giving rise to negative effects on the TTV of the solid body layer that is to be produced.

It is therefore the object of the present invention to provide a method for producing layers of solid material that enables the production of solid state panels or wafers with an even thickness, particularly with a TTV of less than 120 micrometres.

The aforementioned object is achieved with a method according to claim 1 for producing layers of solid material. The method comprises at least the following steps: providing a solid body for separating at least one solid body layer, arranging a receiving layer on the solid body for holding the solid body layer, wherein the receiving layer consists of at least one polymer and one further material, wherein the receiving layer, preferably in terms of volume or mass preferably consists mainly of polymer, wherein the further material has greater thermal conductivity than the polymer, subjecting the receiving layer to thermal stress to generate stresses in the solid body, particularly mechanically, wherein a crack in the solid body spreads along a separation plane due to the stresses, wherein the solid body layer is separated from the solid body by the crack.

Additional advantageous embodiments are the subject matter of the following description and/or the subclaims.

According to a further preferred embodiment of the present invention, the further material is applied to the polymer as a coating, or the polymer is applied to the further material as a coating. This solution is advantageous because the further material can be cooled down quickly, and consequently heat is removed from it due to the direct contact between the further material and the polymer material, which speeds up the cooling of the polymer material component of the receiving layer.

According to a further preferred embodiment of the present invention, the coating, that is to say preferably the further material component, has local weakpoints, in particular, the coating is broken, particularly to follow a deformation that is created through the polymer when the stress is generated. It is also conceivable that several separate sections of the polymer component of the receiving layer are coated with the further material, wherein the individual material components preferably do not form a contiguous structure, but instead are preferably movable towards each other.

According to a further preferred embodiment of the present invention, the thermal conductivity (W/(m*K)) of the further material is preferably more than 5 times greater, more preferably more than 10 times greater, and particularly preferably more than 30, more than 100, more than 200 or more than 300 times greater than that of the polymer or the polymer material component in the receiving layer, wherein the further material is preferably a metal or an alloy. This embodiment is advantageous since the cooling of the polymer material component in the receiving layer can be accelerated as the thermal conductivity of the further material increases.

According to a further preferred embodiment of the present invention, the further material is provided in the form of elongated shavings or splinter-like elements inside a layer structure defined by the polymer, wherein the shavings are preferably aligned such that the longitudinal axes thereof extend orthogonally to the direction of the layer extension. The shavings are preferably introduced into the polymer—which is preferably liquid at the time—when the receiving layer is created, and aligned by applying a magnetic force to it. This embodiment is advantageous since the individual shavings each form individual cold bridges, via which heat can be removed from the polymer material component of the receiving layer very rapidly or the polymer material component of the receiving layer can be cooled very rapidly.

According to a further preferred embodiment of the present invention, the receiving layer is furnished with a plurality of holes, wherein the holes are filled or lined with the further material. This embodiment is advantageous since the position and/or shape of the cold bridge formed by the further material can be defined and created very precisely.

According to a preferred embodiment of the present invention, the stresses for separating the solid body layer are generated by the solid body due to the thermal shock to the receiving layer, in particular a multi-component layer. The thermal shock is preferably a cooling of the receiving layer to or below the ambient temperature and preferably below 10° C. and particularly preferably below 0° C. and more preferably below −10° C. The receiving layer is cooled most preferably in such manner that at least the polymer material component der receiving layer, which preferably consists at least in part of a polymer material, particularly PDMS, and a further material, particularly a metal, undergoes glass transition. In this context, the cooling may be a cooling to below −100° C., which may be carried out with liquid nitrogen, for example. This embodiment is advantageous since the receiving layer shrinks in response to the change in temperature and/or undergoes glass transition, transferring the forces generated thereby to the solid body, by which means mechanical stresses may also be generated in the solid body, initiating the formation and/or propagation of a crack, wherein the crack initially spreads along the first separation plane to split the solid body layer.

According to a preferred embodiment of the present invention, the solid body is arranged on a holding layer for holding the solid body, wherein the holding layer is arranged on a first flat surface portion of the solid body, wherein the first flat surface portion of the solid body is located at a distance from a second flat surface portion of the solid body, wherein the receiving layer is arranged on the second flat surface portion and wherein the separating plane is aligned opposite the first flat surface portion and/or parallel to the second flat surface portion or created parallel thereto.

This embodiment is advantageous since at least portions of the solid body, and preferably all of the solid body is arranged between the holding layer and the receiving layer, so that the stresses for forming the crack or propagating the crack in the solid body may be introduced via one of these layers, or via both layers.

According to another preferred embodiment of the present invention, the solid body comprises silicon and/or gallium and/or perovskite, and the polymer layer and/or the holding layer consist at least partially, and preferably entirely, or up to more than 75% (by volume) of polydimethylsiloxane (PDMS), wherein the holding layer is disposed on an at least partially flat surface of a stabilising device made at least partially of at least one metal. The stabilisation device is preferably a panel, in particular a panel that comprises or is made of aluminium. This embodiment is advantageous because the solid body is defined and held securely by the stabilisation device and the holding layer, so that the stresses can be generated very precisely in the solid body.

The solid body preferably comprises a material or material combination of one of the main groups 3, 4 and 5 of the periodic table of the elements, such as e.g. Si, SiC, SiGe, Ge, GaAs, InP, GaN, $Al_2O_3$ (sapphire), AlN. The solid body particularly preferably includes a combination of elements that occur in the third and the fifth groups of the periodic table. Conceivable materials or material combinations here are e.g. gallium arsenide, silicon, silicon carbide etc. The solid body may further contain or consist of a ceramic (e.g. Al2O3-aluminium oxide), preferred ceramics here being e.g. perovskite ceramics (such as ceramics containing Pb, O, Ti/Zr) in general and lead-magnesium-niobates, barium titanate, lithium titanate, yttrium aluminium garnet, particularly yttrium-aluminium-garnet crystals for solid body laser applications, SAW (Surface Acoustic Wave) ceramics such as lithium niobate, gallium orthophosphate, quartz, calcium titanate, etc. in particular. Thus, the solid body preferably comprises a semiconductor material or a ceramic material, and particularly preferably the solid body is made from at least one semiconductor material or one ceramic material. It is further conceivable for the solid body to comprise a transparent material or to be made of or produced partially from a transparent material such as sapphire. Additional materials that can be considered as a solid body material in this context either alone or in combination with another material are for example "wide band gap" materials, InAlSb, high temperature superconductors, in particular rare earth cuprates (e.g. Yba2Cu3O7).

According to another preferred embodiment of the present invention, the receiving layer is affixed to the solid body by means of a connecting layer, wherein the receiving layer particularly preferably has a plurality of holes for conducting a liquid.

The holes preferably have a diameter of less than 1 mm, preferably less than 0.5 mm and particularly preferably preferably less than 0.1 mm.

According to another preferred embodiment of the present invention, the receiving layer has more than 10 holes, preferably more than 100 holes, and particularly preferably more than 1000 holes.

According to another preferred embodiment of the present invention, preferably at least one further hole is formed in a radius of less than 50 mm, preferably less than 25 mm and particularly preferably less than 5 mm or less than 4 mm or less than 3 mm or less than 2 mm or of less than 1 mm or of less than 0.5 mm about the centre of each hole.

According to another preferred embodiment of the present invention, in order to separate the receiving layer from the solid body, a fluid, particularly a liquid is able to be passed through the holes in the connecting layer, wherein the fluid preferably has the effect of weakening or breaking down the fixing of the receiving layer to the solid body.

According to another preferred embodiment of the present invention, faults are created in the inner structure of the solid body to define the separation plane by means of at least one radiation source, particularly a laser, particularly a femtosecond laser, before or after the receiving layer is positioned on the solid body.

The invention relates further to a wafer that is produced in a method according to any one of claims 1 to 12.

The present invention relates further to a film for generating stresses in a solid body, wherein the film is made from at least one polymer material, particularly PDMS, and from one further material, wherein most of the film measured by volume and/or by mass consists of the polymer material, wherein the further material has greater thermal conductivity than the polymer material, wherein the polymer material preferably undergoes glass transition at a temperature lower than 0° C., particularly at a temperature lower than −50° C.

The present invention relates further to a use of a film according to claim 13 as a receiving layer in a method according to claim 1.

The objects of documents PCT/US2008/012140, PCT/EP2009/067539, DE102013016666.7, WO 2013/113730A1 and DE102014013107.6 are also incorporated in the subject matter of the present invention by reference thereto. Equally, the objects of all further patent applications also submitted by the Applicant on the application date of the present patent application relating to the subject area of producing solid body layers are also incorporated in their entirety in the subject matter of the present patent application.

Further advantages, objective and properties of the present invention will be explained in the following description with reference to the accompanying drawings, in which a wafer production method according to the invention is represented for exemplary purposes. Components or elements in the various drawings of the wafer production method according to the invention which match each other at least substantially in terms of function may be designated with the same reference sign, wherein these components or elements are do not have to be designated or explained in all of the figures.

In the drawing:

FIG. 2a is a receiving layer according to the invention;

FIG. 2b is a receiving layer according to the invention which is arranged on a solid body;

FIG. 2c is a second receiving layer according to the invention which is arranged on a solid body;

FIG. 2d is a third receiving layer according to the invention which is arranged on a solid body; and FIG. 2e is a fourth receiving layer according to the invention which is arranged on a solid body.

Figure 1C:
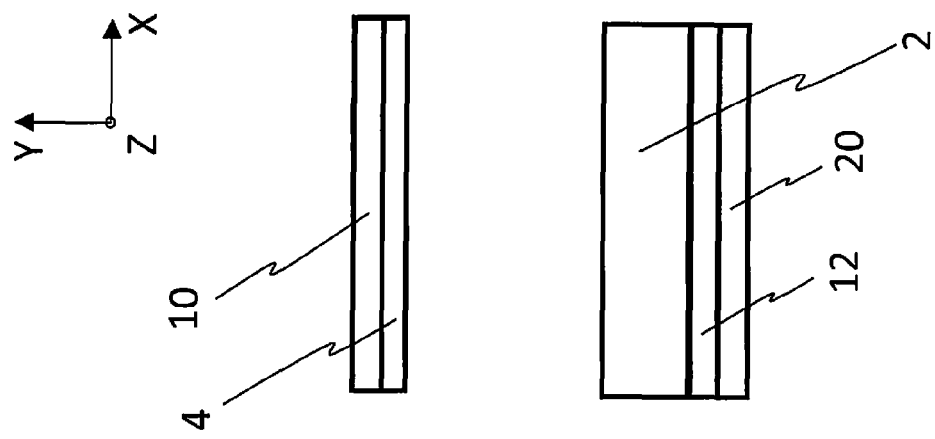
FIG. 1c is a schematic representation of a layer arrangement after a solid body layer is separated from a solid body.
Figure 1B:
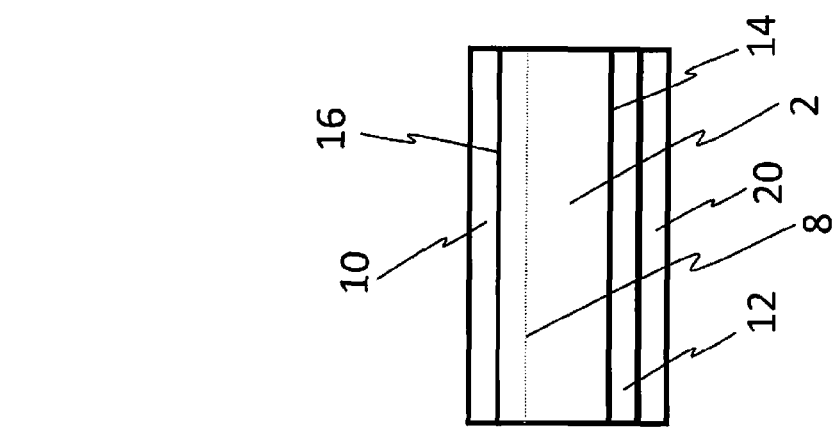
FIG. 1b is a schematic representation of a layer arrangement before a solid body layer is separated from a solid body.
Figure 1A:
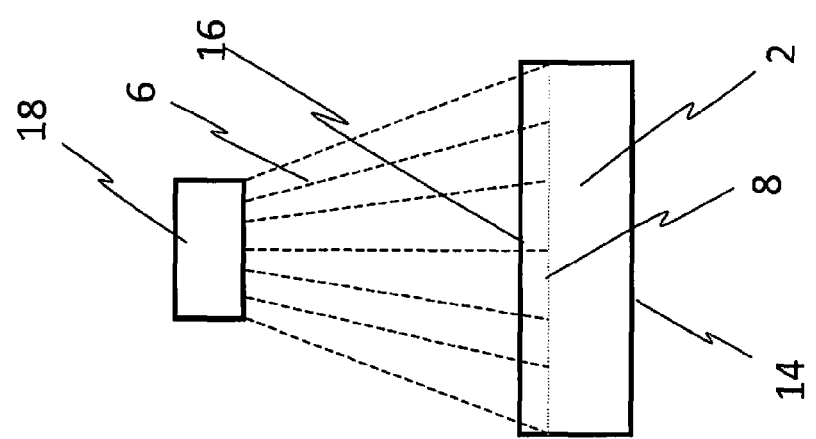
FIG. 1a is a schematic representation of an apparatus for generating local stresses in a solid body.

FIG. 1a shows a workpiece 2 and a substrate arranged in the area of a radiation source 18, particularly a laser, particularly a femtosecond laser (fs-laser). Workpiece 2 preferably has a first, particularly flat, surface portion and a second, particularly flat surface portion 16, wherein the first flat surface portion 14 is preferably aligned substantially or exactly parallel to the second flat surface portion 16. The first flat surface portion 14 and the second flat surface portion 16 preferably delimit workpiece 2 in a Y-direction, which is preferably aligned vertically or perpendicularly. The flat surface portions 14 and 16 preferably each extend in an X-Z plane, wherein the X-Z plane is preferably horizontal. In addition, it may be seen in this representation that radiation source 18 emits beams 6 at workpiece 2 at the same time or with a temporal offset. Beams 6 penetrate to a defined depth in workpiece 2 depending on the configuration, and create local stresses at the respective position or at a predetermined position.

FIG. 1b shows a multi-layer arrangement, wherein workpiece contains crack guide layer 8 and is provided with a holding layer 12 in the area of the first flat surface portion 14, which layer is itself preferably covered by another layer 20, wherein the further layer 20 is preferably a stabilisation device, particularly a metal plate. Preferably a polymer layer 10 is arranged on the second flat surface portion 16 of workpiece 2. The receiving layer and polymer layer 10 and/or the holding layer 12 are preferably at least partially and particularly preferable entirely made from PDMS, and particularly preferably are furnished with a plurality of holes, particularly blind holes and/or passthrough holes.

FIG. 1c shows a state after a crack has been initiated and subsequent crack guidance. Solid body layer 4 adheres to polymer layer 10 and is or can be separated from the remaining residue on the workpiece 2.

FIG. 2a shows a receiving layer 10 or film according to the invention for creating stress in a solid body 2. The film preferably includes at least one polymer material, particularly PDMS, wherein the polymer material preferably undergoes glass transition at a temperature below 20° C., particularly below 10° C., particularly below 0° C., particularly at a temperature below −50° C. The film is particularly preferably furnished with a plurality of holes 36 to allow liquid to pass, wherein the holes 36 each have a diameter smaller than 5 mm.

FIG. 2b shows a solid body layer 4 separated from a solid body 2. A receiving layer 10 or film 10 is still arranged on solid body layer 4, via which the stresses needed to create a crack for separating solid body layer 4 vom solid body 2 were generated. Receiving layer 10 is furnished with a plurality of holes to allow a liquid to pass, wherein receiving layer 10 is affixed on solid body layer 4 via a connecting layer 11.

FIG. 2c shows a further receiving layer 10 or film according to the invention, which also is or can be arranged on solid body 2 by means of a connecting layer 11. Receiving layer 10 or the multi-component receiving layer preferably has a first material component 39, particularly a polymer component, and a second material component 40, particularly a metal component. The second material component 40 preferably represents a coating of the first material component 39 is serves particularly preferably for accelerated cooling of the first material component 39. Receiving layer 10 is preferably exposed to cold, particularly liquid nitrogen from direction 38, which has the effect of cooling second material component 40 rapidly, and particularly due to its direct contact with first material component 39 this too is cooled very rapidly.

FIG. 2d shows a further variant of receiving layer 10 or film according to the invention, which in this case too is formed by first material component 39 and second material component 40. First material component 39 is preferably provided with holes 36, which are filled in by the second material component 40. Second material component 40 preferably coats the top of first material component 39 alternatively or additionally, that is to say parallel to connecting layer 11.

FIG. 2e shows still another variant of receiving layer 10 or film according to the invention, which is again formed by first material component 39 and second material component 40. First material component 39 is preferably furnished with holes 36, which are lined by second material component 40, that is to say the wall that delimits the respective hole 36 is coated with the second material component 40. Second material component 40 preferably coats the top of first material component 39 additionally or alternatively, that is to say parallel to connecting layer 11.

It is further preferably conceivable that the method for producing solid body layers comprises at least the following steps: providing a solid body 2 for separating at least one solid body layer 4, arranging a receiving layer 10 on the solid body 2 for holding the solid body layer 4, wherein the receiving layer consists of at least one polymer and one further material, wherein the receiving layer 10, preferably in terms of volume or mass preferably consists mainly of polymer, wherein the further material has greater thermal conductivity than the polymer, subjecting the receiving layer to thermal stress to generate stresses in the solid body 2, particularly mechanically, wherein a crack in the solid body 2 spreads along a separation plane 8 due to the stresses, wherein the solid body layer 4 is separated from the solid body 2 by the crack.

The film according to the invention for creating stress in a solid body preferably contains at least one polymer material, particularly PDMS, wherein the polymer material preferably undergoes glass transition at a temperature below 0° C., particularly bat a temperature below −50° C. The film particularly preferably has a plurality of holes for directing a liquid, wherein the holes each have a diameter smaller than 5 mm.

LIST OF REFERENCE SIGNS

2 Workpiece
3 Substrate
4 Solid body layer
5 Sacrificial layer
6 Radiation
8 Crack guidance layer
10 Receiving layer/film
11 Connecting layer
12 Holding layer
14 First flat surface portion
16 Second flat surface portion
18 Radiation source/Fault generation device
20 Stabilisation device
36 Hole
38 Cold thermal load
39 First material portion
40 Second material portion
X First direction
Y Second direction
Z Third direction

The invention claimed is:

1. A method for producing solid body layers, the method comprising:
providing a solid body for separating at least one solid body layer,
arranging a receiving layer on the solid body to hold the at least one solid body layer, wherein the receiving layer comprises at least one polymer and one further material, wherein the further material has greater thermal conductivity than the at least one polymer,
subjecting the receiving layer to thermal stress to generate stresses in the solid body, wherein a crack in the solid body spreads along a separation plane wherein a solid body layer is separated from the solid body along the crack, wherein faults are created in an inner structure of the solid body to define the separation plane by means of at least one laser before or after the receiving layer is positioned on the solid body.

2. The method of claim 1, wherein the further material is applied to the at least one polymer as a coating, or the at least one polymer is applied to the further material as a coating.

3. The method of claim 2, wherein the coating has local weak points.

4. The method of claim 3, wherein the thermal conductivity (W/(m*K)) of the further material is more than 5 times greater than that of the at least one polymer.

5. The method of claim 4, wherein the further material is provided in the form of elongated shavings inside a layer structure defined by the at least one polymer.

6. The method of claim 5, wherein the receiving layer has a plurality of holes, wherein the holes are filled or lined with the further material.

7. The method of claim 6, wherein the holes have a diameter of less than 1 mm.

8. The method of claim 7, wherein the receiving layer has more than 10 holes.

9. The method of claim 8, wherein at least one further hole is formed in a radius of less than 50 mm.

10. The method of claim 9, further comprising passing a fluid through the holes in a connecting layer, via which the receiving layer is fixed on the solid body or on the solid body layer, wherein the fluid weakens or breaks down the fixing of the receiving layer on the solid body or on the solid body layer so that the receiving layer is separated from the solid body or from the solid body layer.

11. A wafer produced in accordance with the method of claim 10.

* * * * *